(12) United States Patent
Sidhu et al.

(10) Patent No.: US 9,394,619 B2
(45) Date of Patent: Jul. 19, 2016

(54) METHODS OF ADDING DOPANTS TO CONDUCTIVE INTERCONNECT STRUCTURES IN SUBSTRATE TECHNOLOGIES AND STRUCTURES FORMED THEREBY

(71) Applicant: Intel Corporation, Santa Clara, CA (US)

(72) Inventors: Rajen S. Sidhu, Chandler, AZ (US); Mukul P. Renavikar, Chandler, AZ (US); Sandeep B. Sane, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 170 days.

(21) Appl. No.: 13/795,042

(22) Filed: Mar. 12, 2013

(65) Prior Publication Data

US 2014/0268534 A1     Sep. 18, 2014

(51) Int. Cl.
| | |
|---|---|
| *H05K 1/09* | (2006.01) |
| *H05K 1/03* | (2006.01) |
| *C25D 3/58* | (2006.01) |
| *C25D 5/02* | (2006.01) |
| *H05K 3/42* | (2006.01) |
| *H05K 3/46* | (2006.01) |
| *C23C 18/48* | (2006.01) |

(52) U.S. Cl.
CPC .. *C25D 3/58* (2013.01); *C25D 5/02* (2013.01); *C23C 18/48* (2013.01); *H05K 3/421* (2013.01); *H05K 3/4644* (2013.01)

(58) Field of Classification Search
CPC .............. H05K 1/09; C25D 3/58; C25C 5/02; C25C 18/48
USPC .................................................. 174/255–257
See application file for complete search history.

(56) References Cited

U.S. PATENT DOCUMENTS

| | | | | |
|---|---|---|---|---|
| 2003/0141342 A1* | 7/2003 | Kurata et al. | ................. | 228/56.3 |
| 2006/0060639 A1* | 3/2006 | Byrne et al. | ................ | 228/248.1 |
| 2006/0067852 A1* | 3/2006 | Suh et al. | ....................... | 420/555 |
| 2007/0075430 A1* | 4/2007 | Suh et al. | ....................... | 257/762 |
| 2007/0080451 A1* | 4/2007 | Suh | .............................. | 257/737 |
| 2007/0278089 A1* | 12/2007 | Chen | ..................... | C23C 14/046 204/192.1 |
| 2009/0079063 A1* | 3/2009 | Chrysler et al. | ............. | 257/720 |
| 2009/0197114 A1* | 8/2009 | Shih et al. | ....................... | 428/647 |
| 2010/0155115 A1* | 6/2010 | Pang et al. | ...................... | 174/257 |
| 2011/0186192 A1* | 8/2011 | Mihara | ..................... | C22C 9/06 148/686 |
| 2011/0278716 A1* | 11/2011 | Hsu | ......................... | H01L 24/11 257/737 |
| 2012/0110298 A1* | 5/2012 | Matsuse | ....................... | 711/206 |

* cited by examiner

*Primary Examiner* — Sherman Ng
(74) *Attorney, Agent, or Firm* — Winkle, PLLC

(57) ABSTRACT

Methods of forming a microelectronic packaging structure and associated structures formed thereby are described. Those methods and structures may include forming an opening in a dielectric material of a package substrate, and then plating a conductive interconnect structure in the opening utilizing a plating process. The plating process may comprises a conductive metal and a dopant comprising between about 0.05 and 10 percent weight, wherein the dopant comprises at least one of magnesium, zirconium and zinc.

23 Claims, 7 Drawing Sheets

METHODS OF ADDING DOPANTS TO CONDUCTIVE INTERCONNECT STRUCTURES IN SUBSTRATE TECHNOLOGIES AND STRUCTURES FORMED THEREBY

BACKGROUND OF THE INVENTION

As microelectronic packaging technology advances for higher processor performance, improving adhesion of conductive interconnect structures during substrate plating processes remains an important issue. Device defects can occur due to trace lifting in a package substrate, for example, which can cause electrical and reliability issues. The risk of stress related defects increase as device features are scaled down.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
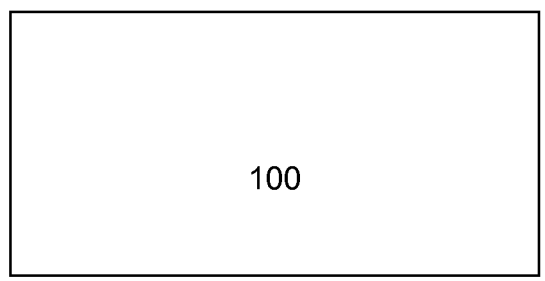
FIGS. 1a-1e represent cross-sectional views of structures according to various embodiments.

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as conductive interconnect structures associated with various package structures, are described. Those methods/structures may include forming an opening in a dielectric material of a package substrate, and then plating a conductive interconnect structure in the opening utilizing a plating process. The plating process may comprises a conductive metal and a dopant comprising between about 0.05 and 10 percent weight, wherein the dopant comprises at least one of magnesium, zirconium and zinc. The conductive structures of the various embodiments disclosed herein enable superplasticity of the conductive interconnect structures, and prevent trace lifting in package structures.

Figure 1B:
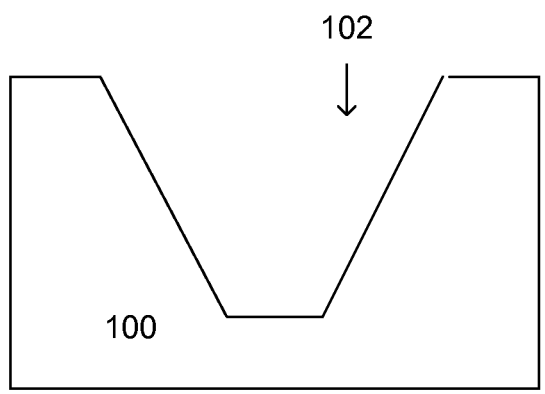

FIGS. 1a-1d illustrate cross-sectional views of embodiments of forming microelectronic structures, such as a conductive interconnect structures with dopant additions, that enhance ductility of the conductive interconnect structure. In an embodiment, an opening 102 may be formed in a portion of a substrate 100, such as a package substrate 100 (FIGS. 1a-1b). The package substrate 100 may comprise any suitable type of substrate capable of providing electrical communications between a device, such as a microelectronic device/die, and a next-level component to which the package substrate 100 is coupled (e.g., a circuit board).

The substrate 100 may comprise materials such as dielectric materials. In another embodiment, the substrate 100 may comprise any suitable type of substrate 100 capable of providing electrical communication between a die and an upper package substrate coupled with a lower package substrate, and in a further embodiment the substrate 100 may comprise any suitable type of substrate capable of providing electrical communication between an upper package and a next-level component to which the package 100 is coupled.

The substrate 100 may also provide structural support for a die. By way of example, in one embodiment, substrate 100 comprises a multi-layer substrate—including alternating layers of a dielectric material and metal—built-up around a core layer (either a dielectric or metal core). In another embodiment, the substrate 100 may comprise a portion of a coreless multi-layer substrate. Other types of substrates and substrate materials may also find use with the disclosed embodiments (e.g., ceramics, sapphire, glass, etc.). Further, according to one embodiment, the substrate 100 may comprise alternating layers of dielectric material and metal that are built-up over a die itself. This process is sometimes referred to as a "bumpless build-up process (BBUL)." Where such an approach is utilized, interconnects may not be needed (as the build-up layers may be disposed directly over a die).

Figure 1C:
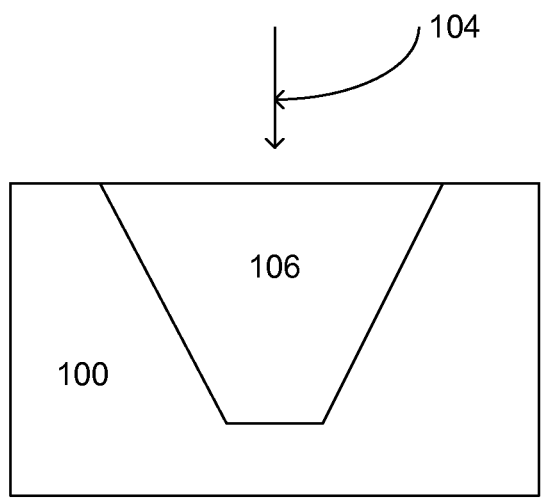

In an embodiment, the opening 102 may comprise any type of suitable opening 102 for microelectronic applications, such as a via opening or a trace opening 102, for example. In an embodiment, a conductive interconnect structure 106 may be formed in the opening 102 (FIG. 1c). The conductive interconnect structure 106 may be formed utilizing a plating process 104, in an embodiment. In an embodiment, the conductive interconnect structure may comprise one of a via and a trace structure. The plating process 104 may comprise any suitable type of plating process 104, such as an electroless or an electrolytic plating process, in an embodiment. The plating process 104 may comprise a plating bath, which in turn may comprise chemical constituents. In an embodiment, the chemical composition of the plating bath/solution may include such constituents/chemicals as copper, chlorine ions, sulfuric acid, copper sulfate, accelerators, suppressants and solvents.

In an embodiment, a copper $2^+$ ion concentration may comprise between about 30 to about 60 percent by weight of the plating solution. In an embodiment, a chlorine ion concentration may comprise less than about 1 weight percent. In an embodiment, a sulfuric acid concentration comprises about 5 to about 25 weight percent, a copper sulfate concentration may comprise between about 15 to about 40 percent by weight, an accelerator may comprise between about 0 to about 5 percent, a suppressor may comprise between about 0 to about 5 percent, and a solvent may comprise between about 0 to about 5 percent of the plating bath solution.

In an embodiment, the plating bath may comprise a weight percent between about 0.05 to about 10 percent of a dopant. In an embodiment, the dopant may comprise at least one of a magnesium, a zinc, and a zirconium species. In another embodiment, a solvent may comprise a remainder amount of the total chemical composition of the plating bath composition. The addition of the dopants enhance the superplasticity of the conductive interconnect structure 106, which may comprise a copper alloy in an embodiment. In an embodiment, the dopant may comprise any such dopant species that is capable of allowing/enhancing grain growth and grain rotation of the grains of the conductive structure 106. The conductive interconnect structure 106 possesses enhanced properties, such as enhanced ductility and compliance, that prevent stress induced defects during package substrate manufacturing, such as stress induced trace lifting in package structures. In an embodiment, the conductive interconnect structure 106 may consist of copper and a dopant, wherein the dopant may comprise at least one of magnesium, zinc and zirconium, and wherein the percentage weight of the total dopant may be less than about 0.18 ppm.

Figure 1D:
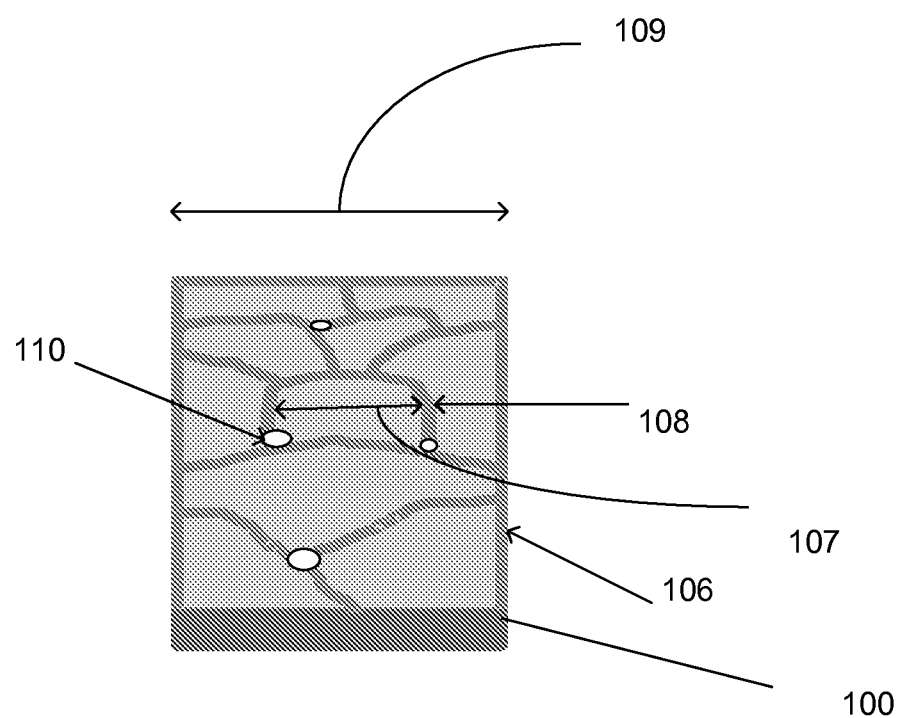

In an embodiment, the dopant may increase the elongation to failure of the conductive interconnect structure 106 by about 200 percent. In an embodiment, the dopant may increase the grain size of the conductive interconnect structure to above about 2 microns. FIG. 1d depicts a cross sectional view of a portion of a substrate 100 comprising a conductive interconnect structure 106 according to the embodiments herein, wherein a grain size 107 of a grain 108 of the conductive interconnect structure 106 may comprise above about 2 microns. In an embodiment, dopants 110 may be disposed within/at grain boundaries (boundary areas between individual grains) of the grains of the conductive interconnect structure 106.

The dopants so disposed allow for viscous glide type behavior of the grains, that is, the dopants allow the grains to glide and rotate within the conductive interconnect structure 106, thus enhancing ductility and reducing stress within the conductive interconnect structure 106. Such enhancement of ductility greatly reduces the tendency for the conductive interconnect structure 106 to fracture during stress, thus increasing reliability and yield of devices incorporating the embodiments of the packaging structures herein. In an embodiment, the conductive interconnect structure 106 may comprise a width 109 of less than about 10 microns.

In an embodiment, the dopants may replace metal atoms, or may be added to the lattice of the conductive interconnect structure as it is being formed/plated within the opening. In an embodiment, the dopants may occupy substitutional and/or interstitial positions within the lattice of the conductive interconnect structure 106. In an embodiment, the viscous glide and rotation of the grains compensate for stress that may be present in the conductive interconnect structure 106, such that vias and trace structures comprising the conductive interconnect structures 106 herein show little to no cracking or separation/lifting from the substrate 100.

Figure 1E:
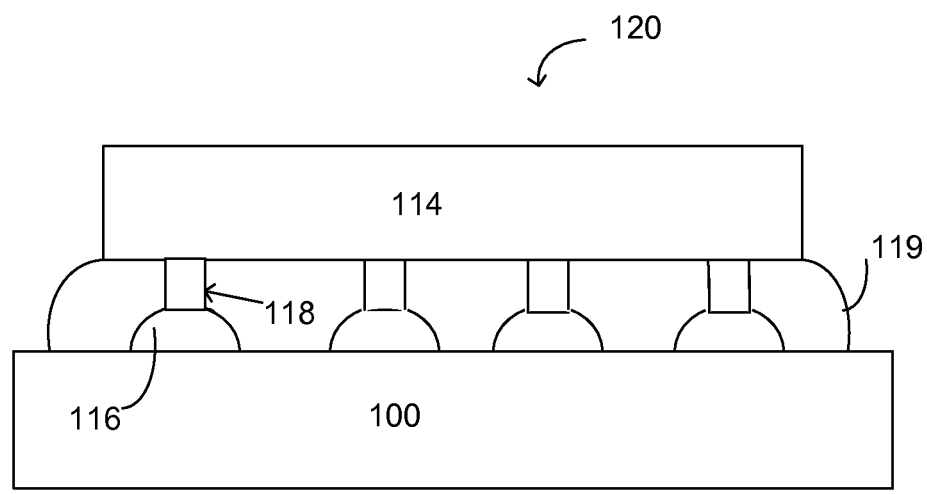

FIG. 1e depicts a package structure 120, wherein conductive bumps 118 are disposed on a bottom surface of a device 114, and solder connections 116 disposed on a package substrate 100 are physically and electrically coupled with the conductive bumps 118. The substrate 100 may comprise any number of conductive interconnect structures 106 (not shown) within and/or on surfaces of the substrate 100, according to embodiments herein. An underfill 119 material surrounds the conductive bumps 118. In an embodiment, each of the conductive bumps 118 may comprise an electrically conductive terminal on the device (e.g., a pad, bump, stud bump, column, pillar, or other suitable structure or combination of structures).

The solder connections 116 may comprise electrically conductive terminals on the package substrate 100 (e.g., a pad, bump, stud bump, column, pillar, or other suitable structure or combination of structures). Solder (e.g., in the form of balls or bumps) may be disposed on the terminals of the substrate 100 and/or die, and these terminals may then be joined using a solder reflow process, for example. Of course, it should be understood that many other types of interconnects and materials are possible (e.g., wirebonds extending between the device 114 and the substrate 100).

The conductive bumps 118 on the device 114 may comprise any suitable material or any suitable combination of materials, whether disposed in multiple layers or combined to form one or more alloys and/or one or more intermetallic compounds. For example, the conductive bumps 118 may include copper, aluminum, gold, silver, nickel, titanium, tungsten, as well as any combination of these and/or other metals. In other embodiments, a conductive bump 118 may comprise one or more non-metallic materials (e.g., a conductive polymer). The solder connections 116 may also comprise any suitable material or any suitable combination of materials, whether disposed in multiple layers or combined to form one or more alloys and/or one or more intermetallic compounds. For example, the solder connections 116 may include copper, aluminum, gold, silver, nickel, titanium, tungsten, as well as any combination of these and/or other metals.

Package structure 120 comprises improved adhesion and reliability between the conductive interconnect structures 106 and the substrate 100 because of the addition of the dopants during the formation of the conductive interconnect structures, as described herein. In an embodiment, the device 114 may comprise one of a microelectronic memory die and a central processing unit die in some cases, but may comprise any type of suitable device 114 according to the particular application in other cases. In an embodiment, the package structure 120 may comprise a coreless, bumpless build up layer (BBUL) package structure 120.

In the package structure of FIG. 1e, the device 114 may be disposed in other locations, such as on a top surface of a BBUL package, for example, and the package structure 120 may comprise any suitable type of package structures capable of providing electrical communications between a microelectronic device, such as a die and a next-level component to which the package structures may be coupled (e.g., a circuit board). In another embodiment, the package structures herein may comprise any suitable type of package structures capable of providing electrical communication between a die and an upper integrated circuit (IC) package coupled with a lower IC package.

A device in the various Figures herein may comprise a silicon logic die or a memory die, for example, or any type of suitable microelectronic device/die, and may be disposed on a back side or on a front side of the package structures herein. In some embodiments the package structures may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

Figure 2A:
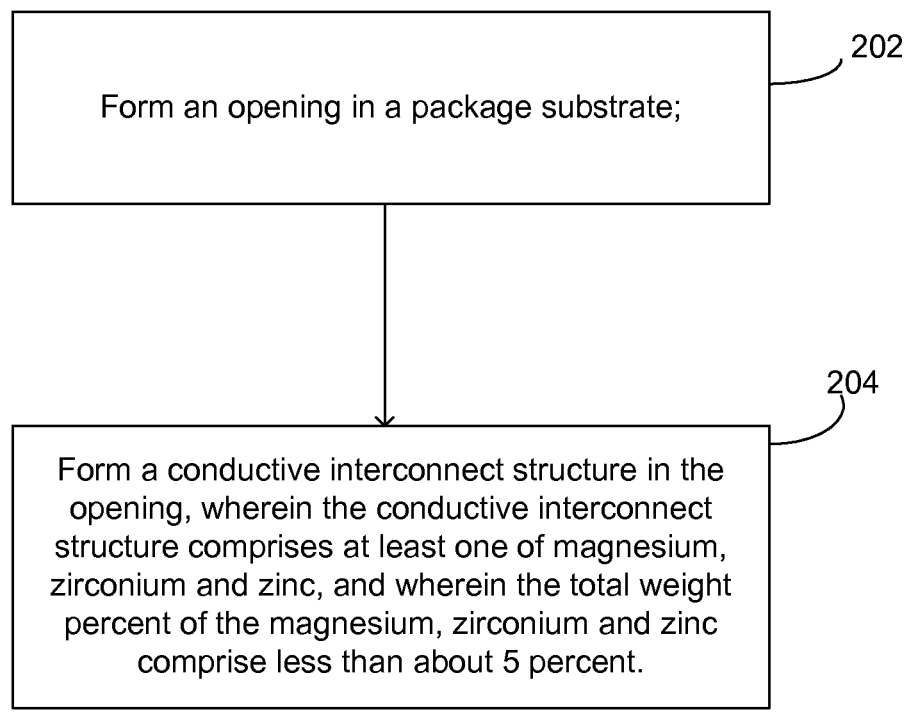
FIGS. 2a-2b represent flow charts of methods according to embodiments.
Figure 2B:
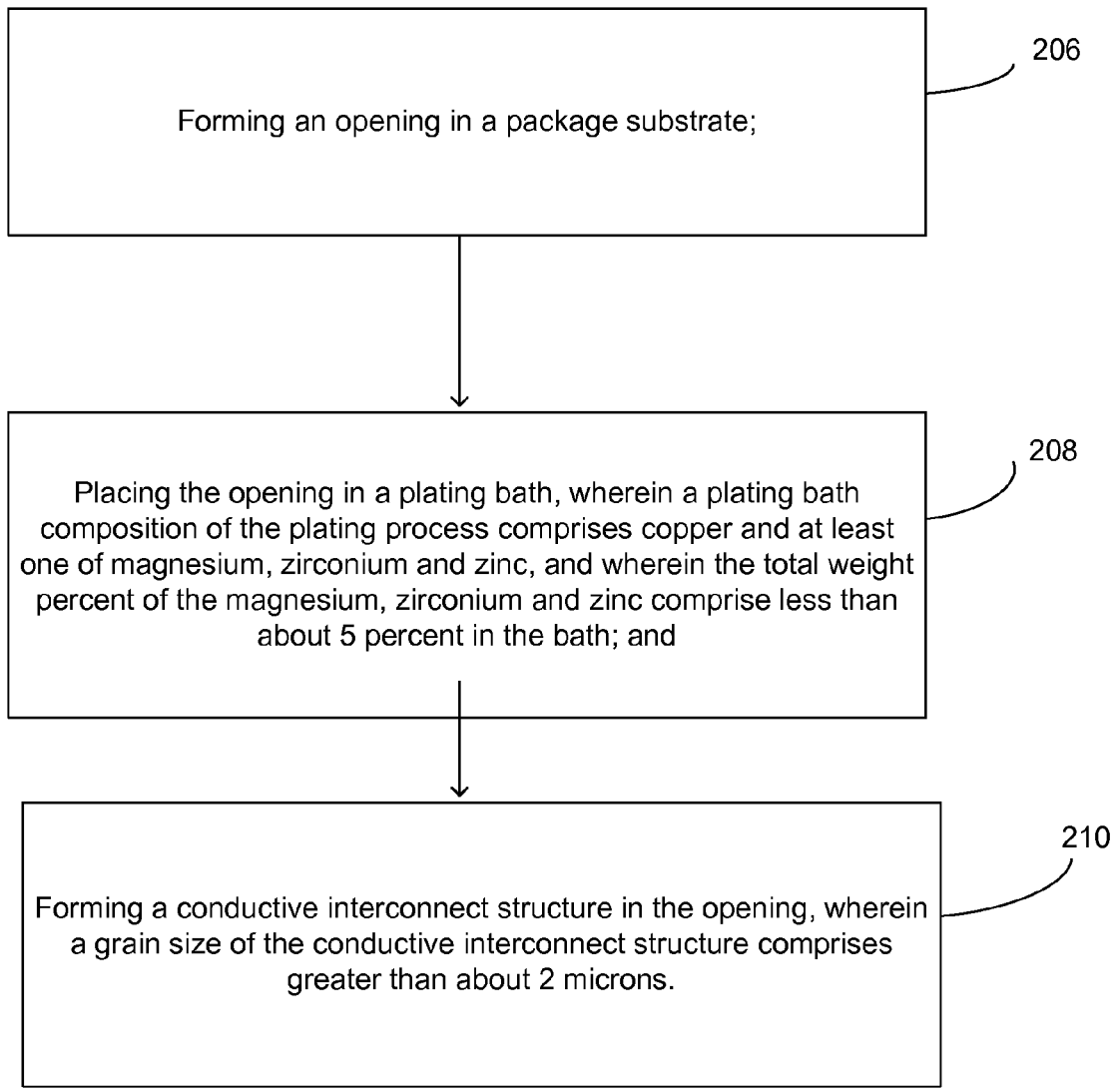

FIG. 2a depicts a flow chart of a method according to an embodiment. At step 202, an opening is formed in a substrate. At step 204, a conductive interconnect structure is formed in the opening, wherein the conductive interconnect structure comprises at least one of magnesium, zirconium and zinc, and wherein the total weight percent of the magnesium, zirconium and zinc comprise less than about 5 percent of the conductive structure. FIG. 2b depicts a flow chart of a method according to an embodiment. At step 206, an opening is formed in a substrate. At step 208, the opening is placed in a plating bath, wherein a plating bath composition of the plating bath comprises copper and at least one of magnesium, zirconium and zinc, and wherein the total weight percent of the magnesium, zirconium and zinc comprise less than about 5 percent in the bath. At step 210, a conductive interconnect structure is formed in the opening, wherein a grain size of the conductive interconnect structure comprises greater than about 2 microns.

The various embodiments of the conductive interconnect structures included herein promote and improve adhesion and mechanical reliability for the package structures that utilize the conductive interconnect structures described herein. By adding dopants in the plating bath/process which enhance the ductility of the conductive interconnect, trace lifting, stress defects and stress failures are greatly reduced in such package structures utilizing the embodiments herein.

Figure 3:
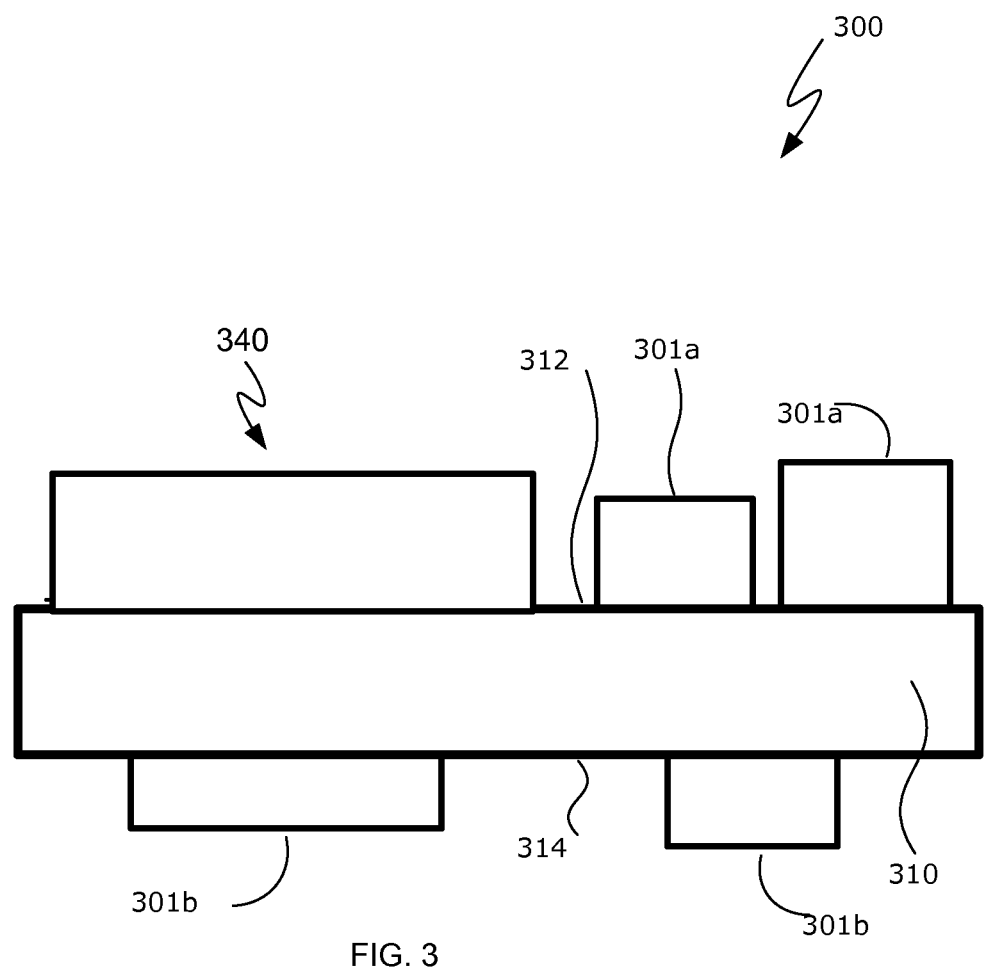
FIG. 3 represents a cross-sectional view of a structure according to embodiments.

Turning now to FIG. 3, illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 120 of FIG. 1e, for example) disposed on the mainboard's first side 312, wherein the package structure 340 may comprise any of the conductive interconnect structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
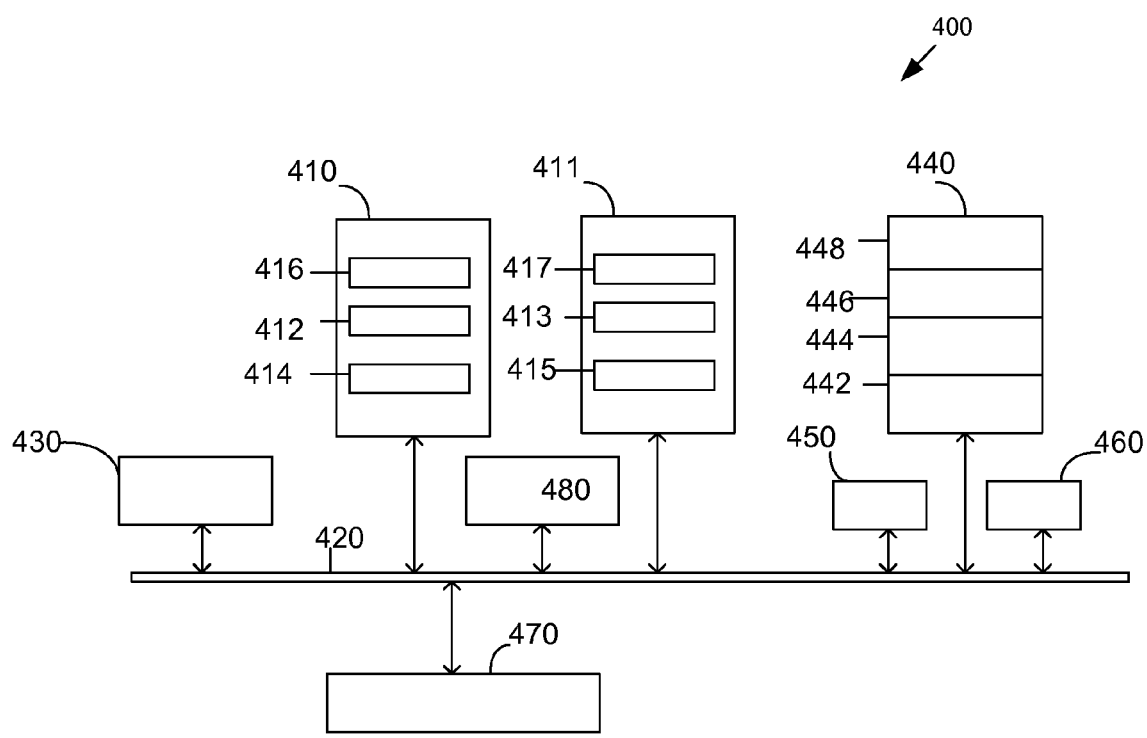
FIG. 4 represents a schematic of a system according to embodiments.

FIG. 4 is a schematic of a computer system 400 according to an embodiment. The computer system 400 (also referred to as the electronic system 400) as depicted can embody/include a package structure/conductive interconnect material that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a handheld reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a structure comprising:
   providing a package substrate;
   forming a conductive interconnect structure on a portion of the package substrate, wherein the conductive interconnect structure consists of copper and a dopant, wherein the dopant is selected from a group consisting of magnesium, zirconium, and a combination of magnesium and zirconium, wherein the dopant ranges from about 0.5 percent weight to about 5 percent weight of the conductive interconnect structure, and wherein a grain size of the conductive interconnect structure comprises above about 2 microns.

2. The method of claim 1 further comprising wherein the package substrate comprises a BBUL package substrate.

3. The method of claim 1 further comprising wherein the dopants allow for individual grains of the conductive interconnect structure to rotate within the conductive interconnect structure.

4. The method of claim 1 further comprising wherein a portion of the dopants are located at grain boundaries between individual grains of the conductive interconnect structure.

5. The method of claim 1 further comprising wherein the conductive interconnect structure is formed utilizing a plating process.

6. The method of claim 1 further comprising wherein the conductive interconnect structure comprises a width less than about 10 microns, and wherein the conductive interconnect structure comprises one of a via and a trace.

7. The method of claim 1 further comprising wherein grains of the conductive interconnect structure are capable of viscous glide and rotation.

8. A package structure comprising:
   a package substrate;
   a conductive interconnect structure disposed on a portion of the package substrate, wherein the conductive interconnect structure consists of copper and a dopant, wherein the dopant is selected from a group consisting of magnesium, zirconium, and a combination of magnesium and zirconium, wherein the dopant has a concentration of less than about 0.18 ppm of the conductive interconnect structure, and wherein a grain size of the conductive interconnect structure comprises above about 2 microns.

9. The package structure of claim 8 further comprising wherein the package substrate comprises a BBUL package substrate.

10. The package structure of claim 8 further comprising wherein the dopants allow for individual grains of the conductive interconnect structure to rotate within the conductive interconnect structure.

11. The package structure of claim 8 further comprising wherein a portion of the dopants are located between individual grains of the conductive interconnect structure.

12. The package structure of claim 8 further comprising wherein the conductive interconnect structure is formed utilizing a plating process.

13. The package structure of claim 8 further comprising wherein the conductive interconnect structure comprises a width less than about 10 microns.

14. The package structure of claim 8 further comprising wherein grains of the conductive interconnect structure are capable of viscous glide and rotation.

15. The package structure of claim 8 further comprising wherein the conductive interconnect structure comprises one of a via and a trace.

16. The package structure of claim 8 further comprising wherein a die is coupled with the package structure.

17. The package structure of claim 8 wherein the package structure further comprises at least one of a CPU and a memory die.

18. The package structure of claim 8 further comprising a system comprising:
   a bus communicatively coupled to the package structure; and
   an eDRAM communicatively coupled to the bus.

19. A method of forming a structure comprising:
   providing a BBUL package substrate;
   forming a conductive interconnect structure on a portion of the package substrate, wherein the conductive interconnect structure consists of copper and a dopant, wherein the dopant is selected from a group consisting of magnesium, zirconium, and a combination of magnesium and zirconium, wherein the dopant ranges from about 0.5 percent weight to about 5 percent weight of the conductive interconnect structure, wherein a grain size of the conductive interconnect structure comprises above about 2 microns, and wherein a portion of the dopants are located at grain boundaries between individual grains of the conductive interconnect structure.

20. The method of claim 19 further comprising wherein the dopants allow for individual grains of the conductive interconnect structure to rotate within the conductive interconnect structure.

21. The method of claim 19 further comprising wherein the conductive interconnect structure is formed utilizing a plating process.

22. The method of claim 19 further comprising wherein the conductive interconnect structure comprises a width less than about 10 microns, and wherein the conductive interconnect structure comprises one of a via and a trace.

23. The method of claim 19 further comprising wherein grains of the conductive interconnect structure are capable of viscous glide and rotation.

* * * * *